United States Patent
Narasimhan

(10) Patent No.: US 7,203,325 B2
(45) Date of Patent: Apr. 10, 2007

(54) AUDIO PROCESSING DEVICE

(75) Inventor: Veerava S. Narasimhan, Yishun (SG)

(73) Assignee: Koninklijke Philips Electronics N.V., Eindhoven (NL)

( * ) Notice: Subject to any disclaimer, the term of this patent is extended or adjusted under 35 U.S.C. 154(b) by 499 days.

(21) Appl. No.: 10/223,341

(22) Filed: Aug. 19, 2002

(65) Prior Publication Data

US 2003/0081797 A1  May 1, 2003

(30) Foreign Application Priority Data

Aug. 23, 2001 (WO) ............... PCT/SG01/00166

(51) Int. Cl.
*H04B 15/00* (2006.01)
*H03G 3/00* (2006.01)

(52) U.S. Cl. ............... 381/94.1; 381/94.5; 381/104; 381/107

(58) Field of Classification Search ......... 381/94.1, 381/94.5, 123, 81, 110, 104, 107
See application file for complete search history.

(56) References Cited

U.S. PATENT DOCUMENTS

| | | | | |
|---|---|---|---|---|
| 4,216,430 A | * | 8/1980 | Amazawa et al. | 455/219 |
| 5,115,471 A | * | 5/1992 | Liden | 381/106 |
| 5,172,358 A | * | 12/1992 | Kimura | 369/47.26 |
| 5,195,075 A | * | 3/1993 | Shiba et al. | 369/53.44 |
| 5,765,053 A | * | 6/1998 | Kobayashi | 386/93 |
| 5,802,186 A | * | 9/1998 | Kubota | 381/107 |
| 6,061,455 A | * | 5/2000 | Hadley et al. | 381/57 |

FOREIGN PATENT DOCUMENTS

| | | |
|---|---|---|
| GB | 1518574 A | 7/1978 |
| GB | 1518574 A  * | 7/1978 |
| WO | WO9501634 | 1/1995 |
| WO | 9930415 A2 | 6/1999 |
| WO | WO 9930415 A2  * | 6/1999 |

* cited by examiner

*Primary Examiner*—Vivian Chin
*Assistant Examiner*—Devona E. Faulk

(57) ABSTRACT

An audio processing device for processing an audio input signal comprises one or more noise reducing means, noise level measuring means and control means connected to the noise level measuring means for controlling the noise reducing means. The audio processing device further comprises an auto signal leveling circuit to which the audio input signal is supplied, while the output signal of the auto signal leveling circuit is supplied to the noise reducing means. The auto signal leveling circuit is controlled by said control means, such that, when the noise measuring means do not detect an audio signal above a certain audio level, the auto signal leveling circuit and at least one of the noise reducing means are switched on, and, when the noise measuring means detect an audio signal above said certain audio level, the auto signal leveling circuit and the noise reducing means are switched off.

3 Claims, 1 Drawing Sheet

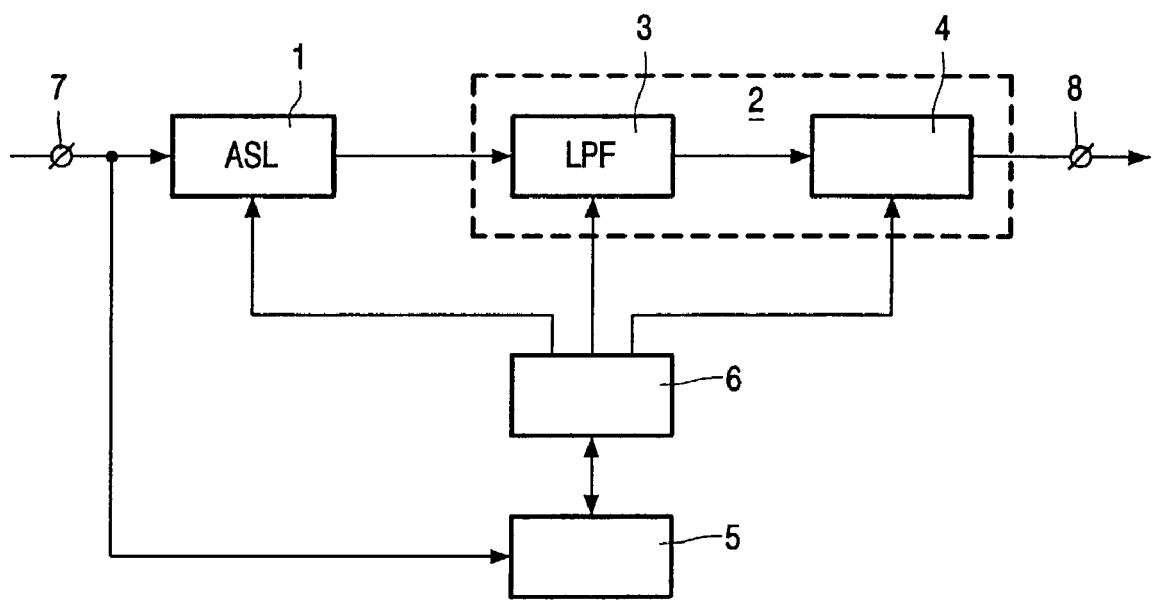

AUDIO PROCESSING DEVICE

The present invention relates to an audio processing device for processing an audio input signal, comprising at least one input terminal for receiving an audio input signal, one or more noise reducing means coupled to the input terminal, noise level measuring means for measuring the noise level at the input terminal and control means connected to said noise level measuring means for controlling the noise reducing means. Such an audio processing device is known from the International patent application WO-A-99/30415.

In the mainstream TV, meeting audio requirements with respect to the signal-to-noise ratio (over 50 dB) is a challenge, particularly when the integrated circuits have analog and switching circuits together. This issue of low signal-to-noise ratio manifests time to time during approbation or while listening to dialogue or speech. Reduction of noise by limiting the audio bandwidth or reducing the audio volume may improve the situation, but may not always be possible or even desirable. From the above document it is known to reduce the noise when by means of noise level measuring means it is established that the noise in the audio input signal exceeds a certain threshold level and that the signal-to-noise ratio is too low. Problems arise when the input signal is strongly changing in time; then the noise reducing means are switched on and off.

The purpose of the invention is to mitigate this problem and to provide for an audio processing device in which the signal-to-noise ratio is further improved. Therefore, according to the invention, the audio processing device as described in the opening paragraph is characterized in that the audio processing device further comprises an auto signal leveling circuit connected between the input terminal and said noise reducing means, said auto signal leveling circuit being controlled by said control means, such that, when the noise measuring means do not detect an audio signal above a certain audio level, the auto signal leveling circuit and at least one of the noise reducing means are switched on, and, when the noise measuring means detect an audio signal above said certain audio level, the auto signal leveling circuit and the noise reducing means are switched off.

In a preferred embodiment the noise reducing means are provided with bandwidth limiting means, particularly low pass filtering means, and volume reducing means. Further, the noise reducing means are provided with switching means, controlled by said control means for supplying the output signal of the auto signal leveling means either directly or via at least one of the noise reducing means to an output terminal of the audio processing means.

An embodiment of the invention will further be described with reference to the accompanying drawing, showing a block diagram of an audio processing device according to the invention.

The drawing shows an auto signal leveling circuit (ASL) 1, noise reducing means 2 comprising bandwidth limiting means in the form of a low pass filter (LPF) 3 and volume reducing means 4, noise level measuring means 5 and control means 6.

Audio input signals are supplied to the ASL 1 and to the noise level measuring means 5 via the input terminal 7 of the audio processing device. Based in the measured noise level, the control means 6, connected to the noise level measuring means 5, supply control signals to switch on or off the ASL 1, to insert or not the LPF 3 and the volume reducing means 4 in the audio signal path between the ASL 1 and the output terminal 8 of the audio processing device.

When the average audio signals are strongly fluctuating in strength and the ASL is switched on, the noise level increases by the gain of the ASL which is annoying. In that case the noise level will be reduced by limiting the bandwidth and/or by reducing the volume of the audio signals. Therefore, switching means, controlled by the control means 6 are incorporated in the LPF and in the volume reducing means to insert the bandwidth limiting means and/or the volume reducing means in the signal path between the ASL 1 and the output terminal 8.

When the ASL is switched off and the audio input signals do not exceed a certain threshold level, the noise level is reduced by inserting the bandwidth limiting means and/or the volume reducing means in the audio signal path. When the audio input signals exceed said threshold level the bandwidth limiting means and/or the volume reducing means are switched out of the audio signal path.

The decision whether the ASL is switched on or off, is taken by the control means 6, based on the information from the noise level measuring means.

The invention claimed is:

1. Audio processing device for processing an audio input signal, comprising at least one input terminal for receiving an audio input signal, one or more noise reducing means coupled to the input terminal, noise level measuring means directly connected to said input terminal for measuring the noise level at the input terminal and control means connected to said noise level measuring means for controlling the noise reducing means, characterized in that the audio processing device further comprises an auto signal leveling circuit connected between the input terminal and said noise reducing means, said auto signal leveling circuit being controlled by said control means, such that, when the noise measuring means do not detect an audio signal above a certain audio level, the auto signal leveling circuit and at least one of the noise reducing means are switched on, and, when the noise measuring means detect an audio signal above said certain audio level, the auto signal leveling circuit and the noise reducing means are switched off.

2. Audio processing device according to claim 1, characterized in that the noise reducing means are provided with bandwidth limiting means, particularly low pass filtering means, and volume reducing means.

3. Audio processing means according to claim 2, characterized in that the noise reducing means are controlled by said control means for supplying the output signal of the auto signal leveling means either directly or via at least one of the noise reducing means to an output terminal of the audio processing means.

\* \* \* \* \*